(12) United States Patent
Shiomi

(10) Patent No.: US 8,877,656 B2
(45) Date of Patent: Nov. 4, 2014

(54) METHOD FOR MANUFACTURING SILICON CARBIDE SEMICONDUCTOR DEVICE

(71) Applicant: Sumitomo Electric Industries, Ltd., Osaka (JP)

(72) Inventor: Hiromu Shiomi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/944,512

(22) Filed: Jul. 17, 2013

(65) Prior Publication Data
US 2014/0057461 A1 Feb. 27, 2014

Related U.S. Application Data

(60) Provisional application No. 61/693,513, filed on Aug. 27, 2012.

(30) Foreign Application Priority Data

Aug. 27, 2012 (JP) ................. 2012-186156

(51) Int. Cl.
*H01L 21/31* (2006.01)
*H01L 21/324* (2006.01)

(52) U.S. Cl.
CPC .................. *H01L 21/324* (2013.01)
USPC ................... 438/778; 438/769; 257/E21.605

(58) Field of Classification Search
USPC ........ 257/E21.4, E21.603, E21.605, E21.615
See application file for complete search history.

(56) References Cited

U.S. PATENT DOCUMENTS

2012/0009801 A1   1/2012  Tanioka et al.

FOREIGN PATENT DOCUMENTS

| JP | 2005-109396 A | 4/2005 |
| JP | 2012-038919 A | 2/2012 |
| WO | WO-2010/103820 A1 | 9/2010 |

OTHER PUBLICATIONS

International Search Report and Written Opinion in PCT International Application No. PCT/JP2013/068850, dated Oct. 15, 2013.

*Primary Examiner* — Cheung Lee
(74) *Attorney, Agent, or Firm* — Venable LLP; Michael A. Sartori; George L. Howarah

(57) ABSTRACT

A method for manufacturing a silicon carbide semiconductor device includes the following steps. A silicon carbide substrate is heated in an atmosphere containing oxygen, so as to form a gate insulating film on and in contact with the silicon carbide substrate. The silicon carbide substrate having the gate insulating film is heated at 1250° C. or more in an atmosphere containing nitrogen and nitrogen monoxide. A value obtained by dividing partial pressure of the nitrogen monoxide by a total of partial pressure of the nitrogen and the partial pressure of the nitrogen monoxide in the second heating step is more than 3% and less than 10%. Accordingly, there can be provided a method for manufacturing a silicon carbide semiconductor device having high mobility.

5 Claims, 4 Drawing Sheets

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device, more particularly, a method for manufacturing a silicon carbide semiconductor device including the step of forming a gate insulating film on a silicon carbide substrate.

2. Description of the Background Art

In recent years, in order to achieve high breakdown voltage, low loss, and the like in a semiconductor device, silicon carbide has begun to be adopted as a material for the semiconductor device. Silicon carbide is a wide band gap semiconductor having a band gap larger than that of silicon, which has been conventionally widely used as a material for semiconductor devices. Hence, by adopting silicon carbide as a material for a semiconductor device, the semiconductor device can have a high breakdown voltage, reduced on-resistance, and the like. Further, the semiconductor device thus adopting silicon carbide as its material has characteristics less deteriorated even under a high temperature environment than those of a semiconductor device adopting silicon as its material, advantageously.

An exemplary semiconductor device employing silicon carbide as its material is a MOSFET (Metal Oxide Semiconductor Field Effect Transistor). In the MOSFET, a gate insulating film made of silicon dioxide is formed on a silicon carbide substrate. Interface states are formed between the silicon carbide substrate and the gate insulating film made of silicon dioxide. The interface states result in decrease of mobility. For example, WO 2010/103820 describes that in order to inactivate interface states, heating treatment is performed in nitrogen monoxide gas or dinitrogen monoxide gas. According to the method described in WO 2010/103820, the heating treatment is performed under conditions that nitrogen and nitrogen monoxide are mixed at a ratio of 1:1 to 1:9.

However, a MOSFET manufactured using this method does not have sufficiently high mobility.

SUMMARY OF THE INVENTION

The present invention has been made in view of the foregoing problem, and has its object to provide a method for manufacturing a silicon carbide semiconductor device having high mobility.

As a result of diligent study on a relation between mobility of a MOSFET and nitriding annealing, the inventor has obtained the following knowledge and arrived at the present invention. When heating a silicon carbide substrate having a silicon dioxide film formed thereon under a nitrogen monoxide atmosphere, dangling bonds in an interface between the silicon dioxide film and the silicon carbide substrate are terminated by nitrogen atoms. Accordingly, electrons flowing in a channel can be suppressed from being trapped in the dangling bonds. As a result, the electrons flowing in the channel can be suppressed from being scattered by electrons trapped by the dangling bonds, thereby achieving improved channel mobility.

However, when the silicon carbide substrate is heated at a temperature of less than 1250° C., nitrogen monoxide is not sufficiently diffused into the interface between the silicon dioxide film and the silicon carbide substrate, with the result that the dangling bonds are not sufficiently terminated by nitrogen. Moreover, at a high temperature, nitrogen monoxide is decomposed to nitrogen and oxygen. When the nitrogen monoxide concentration is high, an excess amount of oxygen is generated. The excess amount of oxygen generated causes development of oxidization also during the nitrogen monoxide treatment, with the result that a new silicon dioxide layer not sufficiently nitrided is generated in the interface between the silicon carbide substrate and the silicon dioxide layer. For this reason, it is considered that the mobility is decreased.

To address this, a method for manufacturing a silicon carbide semiconductor device according to the present invention includes the following steps. A silicon carbide substrate is heated in an atmosphere containing oxygen, so as to form a gate insulating film on and in contact with the silicon carbide substrate (first heating step). The silicon carbide substrate having the gate insulating film is heated at 1250° C. or more in an atmosphere containing nitrogen and nitrogen monoxide (second heating step). A value obtained by dividing partial pressure of the nitrogen monoxide by a total of partial pressure of the nitrogen and the partial pressure of the nitrogen monoxide in the second heating step is more than 3% and less than 10%.

According to the method for manufacturing the silicon carbide semiconductor device in the present invention, the value (hereinafter, also referred to as "NO partial pressure") obtained by dividing the partial pressure of the nitrogen monoxide by the total of the partial pressure of the nitrogen and the partial pressure of the nitrogen monoxide in the second heating step is more than 3% and less than 10%. When the NO partial pressure is equal to or less than 3%, dangling bonds existing between the silicon carbide substrate and the gate insulating film are not sufficiently terminated by nitrogen. When the NO partial pressure is equal to or more than 10%, an excess amount of oxygen is generated due to decomposition of nitrogen monoxide. Accordingly, a silicon dioxide layer not sufficiently nitrided is generated in the interface, thus resulting in decreased mobility. By setting the NO partial pressure at a value of more than 3% and less than 10%, the silicon carbide semiconductor device having high mobility can be manufactured.

Preferably in the method for manufacturing the silicon carbide semiconductor device, in the second heating step, the silicon carbide substrate having the gate insulating film is heated at 1350° C. or less. Because the silicon carbide substrate having the gate insulating film is heated at 1350° C. or less, the nitrogen monoxide can be suppressed from excessively decomposed. Accordingly, oxygen can be suppressed from being excessively generated to decrease mobility. Further, a difference in nitrogen monoxide concentration between an upstream region and a downstream region of the flow path of the nitrogen monoxide gas can be reduced, thereby reducing fluctuations in mobility among wafers in the same batch.

Preferably in the method for manufacturing the silicon carbide semiconductor device, the silicon carbide substrate having the gate insulating film is heated in an inert gas atmosphere after the second heating step (third heating step). In the third heating step, the silicon carbide substrate has a temperature higher than that of the silicon carbide substrate in the first heating step.

Accordingly, carbon in the interface between the silicon carbide substrate and the gate insulating film can be effectively diffused. As a result, mobility can be suppressed from being decreased by electrons being scattered by carbon.

Preferably, the method for manufacturing the silicon carbide semiconductor device further includes a step of substituting oxygen in the atmosphere with nitrogen between the first heating step and the second heating step. By substituting oxygen with nitrogen, development of oxidization can be suppressed.

Preferably in the method for manufacturing the silicon carbide semiconductor device, after the step of substituting the oxygen with the nitrogen, the temperature of the silicon carbide substrate is changed to the temperature in the second heating step. By changing the temperature of the silicon carbide substrate after the step of substituting the oxygen with the nitrogen, development of oxidization can be suppressed more securely.

As apparent from the description above, there can be provided a method for manufacturing a silicon carbide semiconductor device having high mobility.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
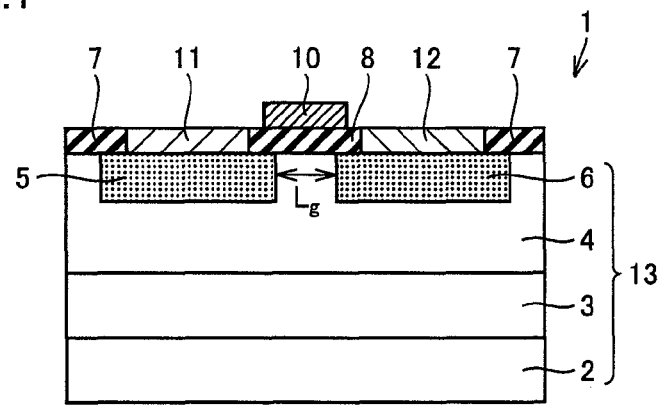
FIG. 1 is a schematic cross sectional view schematically showing a configuration of a silicon carbide semiconductor device according to a first embodiment of the present invention.

The following describes embodiments of the present invention with reference to figures. It should be noted that in the below-mentioned figures, the same or corresponding portions are given the same reference characters and are not described repeatedly. Regarding crystallographic indications in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification. For description of an angle, a system in which an omnidirectional angle is 360° is employed.

(First Embodiment)

Referring to FIG. 1, the following describes a configuration of a silicon carbide semiconductor device according to a first embodiment of the present invention.

Silicon carbide semiconductor device 1 is, for example, a lateral type MOSFET (Metal Oxide Semiconductor Field Effect Transistor), and mainly includes a silicon carbide substrate 13, a gate insulating film 8, a gate electrode 10, a source electrode 11, and a drain electrode 12. Silicon carbide substrate 13 includes: a substrate 2; an epitaxial layer 3 formed on substrate 2 and made of silicon carbide; a p type layer 4 formed on epitaxial layer 3 and made of silicon carbide; and n+ regions 5, 6 formed in a surface of p type layer 4 with a space interposed therebetween. Substrate 2 is made of single-crystal silicon carbide. For substrate 2, a substrate having any plane orientation and any off angle can be employed.

P type layer 4 formed on epitaxial layer 3 contains an impurity of p type conductivity. Further, an impurity having n type conductivity is implanted in each of n+ regions 5, 6. To cover p type layer 4 and n+ regions 5, 6, gate insulating film 8 is formed. Between gate insulating film 8 and oxide films 7, openings are formed at regions above n+ regions 5, 6. In the openings, source electrode 11 and drain electrode 12 are formed which are respectively electrically connected to n+ regions 5, 6. On gate insulating film 8, gate electrode 10 is disposed. A distance between n+ regions 5, 6, i.e., a channel length Lg can be set at, for example, approximately 100 μm. Further, a channel width can be, for example, twice as large as channel length Lg (approximately 200 μm).

In silicon carbide semiconductor device 1 shown in FIG. 1, an oxidization treatment step, a nitrogen annealing treatment step, and a post-heat treatment step are performed as described below, thereby reducing an interface state density in an interface between p type layer 4, which serves as a semiconductor layer, and gate insulating film 8. For an atmosphere containing nitrogen, a nitrogen oxide can be used, for example. Specifically, nitrogen monoxide gas can be used.

The interface state density is reduced presumably due to the following reason. That is, in the case where gate insulating film 8 is formed by means of thermal oxidization or the like, a multiplicity of interface states are formed at the interface between gate insulating film 8 and p type layer 4 serving as the semiconductor layer. Accordingly, without any modification, channel mobility in the channel region will be drastically decreased as compared with its theoretical value. Nitrogen atoms are introduced into the interface region between gate insulating film 8 and p type layer 4 by means of below-described nitrogen annealing, and then the post-heat treatment step is performed, thereby reactivating the nitrogen atoms thus introduced through the nitrogen annealing. This facilitates termination of dangling bonds. Moreover, the post-heat treatment allows carbon atoms, which are cause of the dangling bonds, to be diffused from the interface. Accordingly, the density of the carbon atoms is reduced in the interface. As a result, it is considered that the influence of the above-described interface states can be reduced to improve channel mobility.

Figure 2:
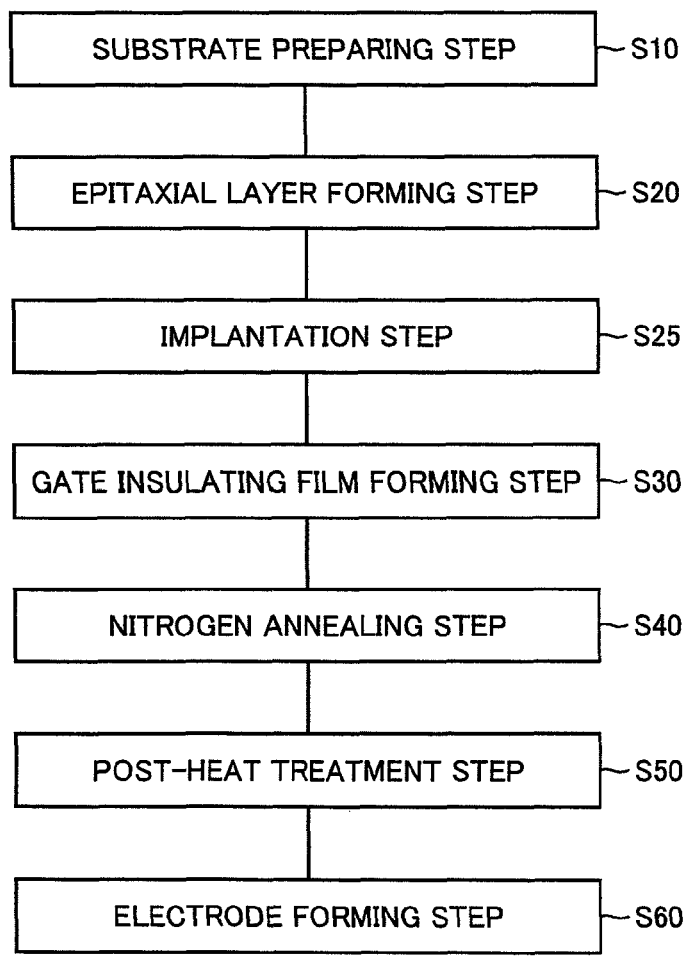
FIG. 2 is a flowchart schematically showing a method for manufacturing the silicon carbide semiconductor device according to the first embodiment of the present invention.

Referring to FIG. 2 to FIG. 5, the following describes a method for manufacturing a silicon carbide semiconductor device according to the present embodiment. First, as shown in FIG. 2, a substrate preparing step (S10) is performed. In this step (S10), for example, substrate 2 is prepared which is made of silicon carbide of polytype of 4H and which has n type conductivity. Substrate 2 prepared has a main surface having any plane orientation. For example, a substrate 2 may be employed which has a main surface inclined relative to a (0001) plane by a predetermined off angle (for example, approximately 8° or less). Alternatively, for example, as substrate 2, a silicon carbide substrate may be prepared which has a main surface corresponding to a {03-38} plane and which has n type conductivity. Further, the main surface may correspond to a {0-11-2} plane. The {0-11-2} plane may be constructed from a {0-33-8} plane and a {0-11-1} plane.

Next, an epitaxial layer forming step (S20) is performed. Specifically, epitaxial layer 3 (see FIG. 1) is formed on substrate 2. The epitaxial layer is a layer made of silicon carbide, for example.

Next, an implantation step (S25) is performed. Specifically, first, an impurity having p type conductivity (for example, aluminum (Al)) is implanted into epitaxial layer 3 to form p type layer 4 (see FIG. 1). Next, an impurity having n type conductivity is implanted to form n+ regions 5, 6 (see FIG. 1). An exemplary, usable impurity having n type conductivity is phosphorus (P). Any conventionally known method can be used to form n+ regions 5, 6. An example of the method is as follows. That is, an oxide film is formed to cover the upper surface of p type layer 4 and is then provided, by means of photolithography and etching, with openings in conformity with regions in which n+ regions 5, 6 are to be formed. Using, as a mask, the oxide film thus having the openings, the impurity is implanted to form n+ regions 5, 6 described above.

Next, activation annealing treatment is performed to activate the implanted impurities. In this activation annealing treatment, for example, silicon carbide substrate 13 is heated at a heating temperature of 1700° C. for a heating time of 30 minutes.

Next, a gate insulating film forming step (S30) is performed as shown in FIG. 2. Specifically, for example, the upper surfaces of p type layer 4 and n+ regions 5, 6 are subjected to sacrifice oxidization treatment, and thereafter gate insulating film 8 is formed on silicon carbide substrate 13. More specifically, referring to FIG. 4, silicon carbide substrate 13 is heated in an atmosphere containing oxygen, thereby forming gate insulating film 8 on and in contact with silicon carbide substrate 13 (first heating step). Gate insulating film 8 has a thickness of, for example, 50 nm. Gate insulating film 8 is formed by means of, for example, thermal oxidization. The thermal oxidization treatment is performed, for example, at an oxidizing temperature of not less than 1100° C. and not more than 1400° C. in an oxygen-containing atmosphere or a diluted oxygen atmosphere. The thermal oxidization treatment is performed for a period of time appropriately determined depending on the film thickness of gate insulating film 8 to be formed. It should be noted that the upper surfaces of p type layer 4 and n+ regions 5, 6 may be cleaned before the oxidization in gate insulating film forming step (S30). As a cleaning method, any conventionally known cleaning method can be used.

Next, a nitrogen annealing step (S40) is performed as shown in FIG. 2. Specifically, silicon carbide substrate 13 having gate insulating film 8 is heated at 1250° C. or more in an atmosphere containing nitrogen and nitrogen monoxide (second heating step). A value obtained by dividing partial pressure of the nitrogen monoxide by a total of partial pressure of the nitrogen and the partial pressure of the nitrogen monoxide in the second heating step is more than 3% and less than 10%. The heating time is, for example, approximately 1 hour. As a result, nitrogen atoms can be introduced into the interface region between gate insulating film 8 and p type layer 4 as well as the interface region between gate insulating film 8 and each of n+ regions 5, 6.

In the second heating step, the NO partial pressure is preferably not less than 4% and not more than 9%, more preferably, not less than 5% and not more than 9%. Further, the heating temperature in the second heating step is preferably not less than 1250° C. and not more than 1350° C., more preferably, not less than 1250° C. and not more than 1330° C., further preferably, not less than 1250° C. and not more than 1300° C.

Next, as shown in FIG. 2, a post-heat treatment step (S50) is performed. Specifically, after nitrogen annealing step (S40), silicon carbide substrate 13 having gate insulating film 8 is heated in an inert gas atmosphere (third heating step). Examples of the inert gas include argon gas, nitrogen gas, and the like.

It should be noted that gate insulating film forming step (S30), nitrogen annealing step (S40), and post-heat treatment step (S50) are performed by placing silicon carbide substrate 13 in a furnace and heating the furnace using heating units disposed in the circumference of the furnace. The furnace has a cross section having a circular tube shape, and the circle has a diameter of approximately 200 mm, for example. For the furnace, there are a furnace of solid silicon carbide type and a furnace of silicon carbide coat type. The furnace of solid silicon carbide type is formed only of a silicon carbide coating formed using CVD (Chemical Vapor Deposition). In the furnace of silicon carbide coat type, a sintered body of silicon carbide is coated with silicon carbide formed using the CVD. Preferably, the furnace is of solid silicon carbide type.

Figure 3:
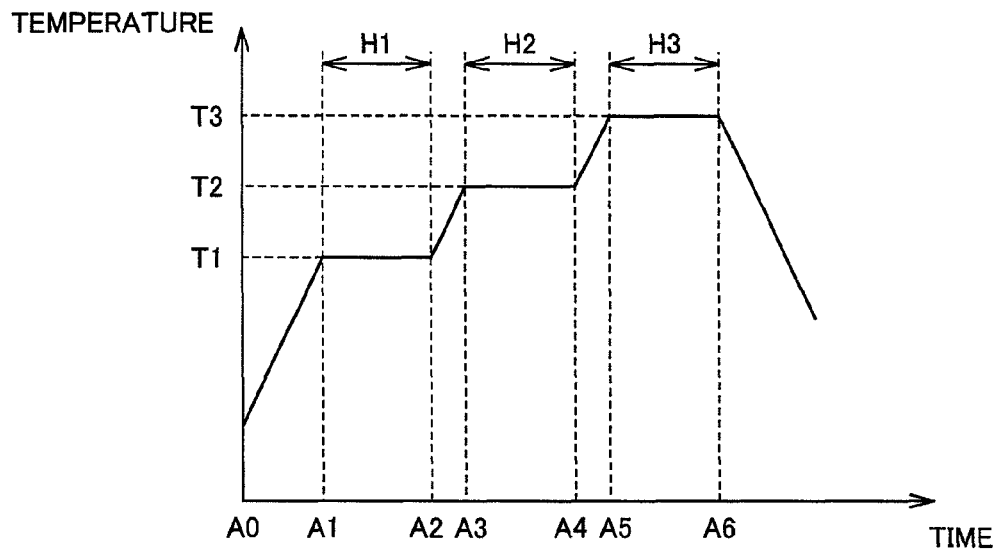
FIG. 3 schematically shows a relation between temperature and time in a gate insulating film forming step, a nitrogen annealing step, and a post-heat treatment step of the method for manufacturing the semiconductor device in FIG. 2.
Figure 4:
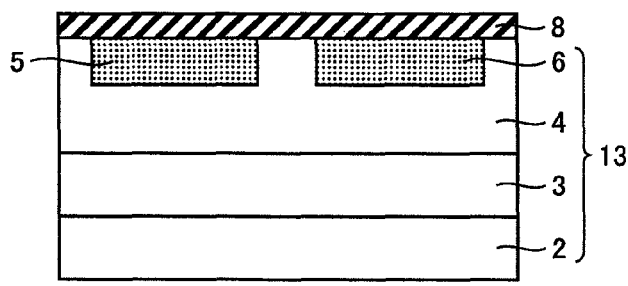
FIG. 4 is a schematic cross sectional view for schematically illustrating a first step of the method for manufacturing the silicon carbide semiconductor device in the first embodiment of the present invention.

Referring to FIG. 3, the following fully describes a temperature profile in gate insulating film forming step (S30), nitrogen annealing step (S40), and post-heat treatment step (S50). In FIG. 3, the horizontal axis represents heating time, whereas the vertical axis represents heating temperature. First, silicon carbide substrate 13 is placed in the furnace at time A0 to start heating of silicon carbide substrate 13. During a period of time A1 to time A2, silicon carbide substrate 13 is heated, for example, at a temperature of 1200° C. for approximately 1 hour (first heating step H1), thereby forming gate insulating film 8 on silicon carbide substrate 13. The atmospheric gas in first heating step H1 is, for example, oxygen gas.

At time A2, the oxygen of the atmospheric gas in the furnace is substituted with nitrogen. In the present embodiment, the oxygen of the atmosphere in the furnace is substituted with nitrogen while changing the temperature of silicon carbide substrate 13 from temperature T1 of first heating step H1 to temperature T2 of the second heating step between first heating step H1 and second heating step H2. The temperature of silicon carbide substrate 13 is increased from temperature T1 to temperature T2 at a rate of, for example, approximately 10° C. per minute. It should be noted that nitrogen gas may be introduced into the furnace while maintaining the temperature of silicon carbide substrate 13 at, for example, the temperature of first heating step H1, then the oxygen gas of the atmospheric gas may be substituted with nitrogen gas in the furnace, and then the temperature of silicon carbide substrate 13 may be changed to the temperature of second heating step H2.

Next, during a period of time A3 to time A4, silicon carbide substrate 13 is heated in an atmosphere of nitrogen gas and nitrogen monoxide gas (second heating step H2). In second heating step H2, silicon carbide substrate 13 is heated at a heating temperature of, for example, 1250° C. for, for example, approximately 80 minutes. It should be noted that a value obtained by dividing partial pressure of the nitrogen monoxide by a total of partial pressure of the nitrogen and the partial pressure of the nitrogen monoxide in second heating step H2 is more than 3% and less than 10%.

Next, at time A4, the mixed gas atmosphere of the nitrogen gas and the nitrogen monoxide gas in the furnace is substituted with an argon atmosphere. The atmospheric gas may be substituted while maintaining the temperature of silicon carbide substrate 13 at a constant temperature or while changing the temperature of silicon carbide substrate 13. Next, during a period of time A5 to time A6, silicon carbide substrate 13 is heated in the argon gas atmosphere (third heating step H3). In third heating step H3, silicon carbide substrate 13 is heated at a heating temperature of, for example, 1350° C. for a heating time of, for example, not less than approximately 1 hour and not more than approximately 4 hours.

As shown in FIG. 3, the heating temperature in third heating step H3 may be set to be higher than the heating treatment temperature in second heating step H2. For example, in the case where heating temperature T2 in the second heating step is 1250° C., heating temperature T3 in the third heating step can be not less than 1250° C., more preferably, not less than 1300° C. and not more than 1400° C. Preferably, heating temperature T3 of silicon carbide substrate 13 in third heating step H3 is higher than heating temperature T1 of silicon carbide substrate 13 in first heating step H1.

Figure 5:
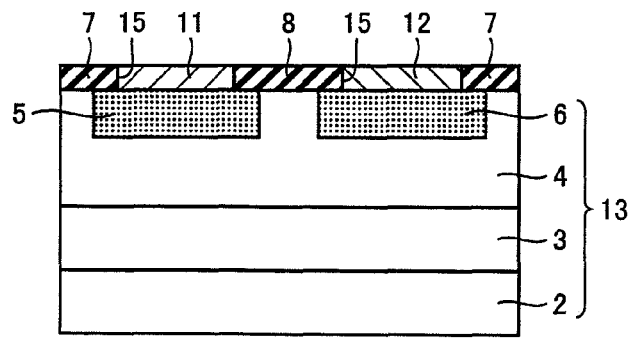
FIG. 5 is a schematic cross sectional view for schematically illustrating a second step of the method for manufacturing the silicon carbide semiconductor device in the first embodiment of the present invention.

Next, as shown in FIG. 2, an electrode forming step (S60) is performed. Specifically, a resist film having a pattern is formed on gate insulating film 8 by means of the photolithography method. By removing portions of gate insulating film 8 using this resist film as a mask, openings are formed in the regions located above n+ regions 5, 6. In each of the openings, as shown in FIG. 5, a conductor film to be formed into each of source electrode 11 and drain electrode 12 is formed. The conductor film is formed with the above-described resist film remaining thereon. Thereafter, a portion of the conductor film above gate insulating film 8 is removed (lifted off) together with the resist film by removing the resist film, thereby forming source electrode 11 and drain electrode 12 as shown in FIG. 5.

Next, gate electrode 10 (see FIG. 1) is formed on gate insulating film 8. This gate electrode 10 is formed by forming a doped polysilicon film, forming a resist film thereon, forming an electrode pattern by means of photolithography, and then performing dry etching. In this way, silicon carbide semiconductor device 1 shown in FIG. 1 is obtained.

The following describes function and effect of the method for manufacturing the silicon carbide semiconductor device according to the present embodiment.

According to the method for manufacturing silicon carbide semiconductor device 1 in the present embodiment, the value obtained by dividing the partial pressure of the nitrogen monoxide by the total of the partial pressure of the nitrogen and the partial pressure of the nitrogen monoxide in the second heating step is more than 3% and less than 10%. When the NO partial pressure is equal to or less than 3%, dangling bonds existing between silicon carbide substrate 13 and gate insulating film 8 are not sufficiently terminated by nitrogen. When the NO partial pressure is equal to or more than 10%, an excess amount of oxygen is generated due to decomposition of nitrogen monoxide. Accordingly, a silicon dioxide layer not sufficiently nitrided is generated in the interface, thus resulting in decreased mobility. By setting the NO partial pressure at a value of more than 3% and less than 10%, silicon carbide semiconductor device 1 having high mobility can be manufactured.

Further, according to silicon carbide semiconductor device 1 in the present embodiment, in the second heating step, silicon carbide substrate 13 having gate insulating film 8 is heated at 1350° C. or less. Because silicon carbide substrate 13 having gate insulating film 8 is heated at 1350° C. or less, nitrogen monoxide can be suppressed from excessively decomposed. Accordingly, oxygen can be suppressed from being excessively generated to decrease mobility. Further, a difference in nitrogen monoxide concentration between an upstream region and a downstream region of the flow path of the nitrogen monoxide gas can be reduced, thereby reducing fluctuations in mobility among wafers in the same batch.

Further, according to silicon carbide semiconductor device 1 in the present embodiment, after the second heating step, silicon carbide substrate 13 having gate insulating film 8 is heated in an inert gas atmosphere (third heating step). In the third heating step, silicon carbide substrate 13 has a temperature higher than the temperature of silicon carbide substrate 13 in the first heating step. Accordingly, carbon in the interface between silicon carbide substrate 13 and gate insulating film 8 can be effectively diffused. As a result, mobility can be suppressed from being decreased by electrons being scattered by carbon.

Moreover, according to silicon carbide semiconductor device 1 in the present embodiment, the step of substituting oxygen in the atmosphere with nitrogen is performed between the first heating step and the second heating step. By substituting oxygen with nitrogen, development of oxidization can be suppressed.

Moreover, according to silicon carbide semiconductor device 1 in the present embodiment, after the step of substituting oxygen with nitrogen, the temperature of silicon carbide substrate 13 is changed to the temperature in the second heating step. By changing the temperature of silicon carbide substrate 13 after the step of substituting oxygen with nitrogen, development of oxidization can be suppressed more securely.

(Second Embodiment)

The following describes a configuration of a silicon carbide semiconductor device 1 according to a second embodiment of the present invention.

Figure 6:
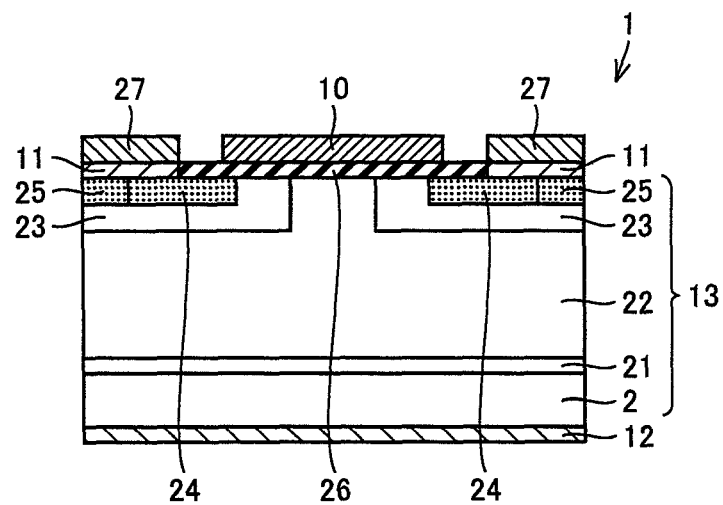
FIG. 6 is a schematic cross sectional view schematically showing a configuration of a silicon carbide semiconductor device according to a second embodiment of the present invention.

Referring to FIG. 6, silicon carbide semiconductor device 1 according to the present invention is a vertical type DiMOSFET (Double Implanted MOSFET), and includes a substrate 2, a buffer layer 21, a breakdown voltage holding layer 22, p regions 23, n+ regions 24, p+ regions 25, a gate insulating film 26, source electrodes 11, upper source electrodes 27, a gate electrode 10, and a drain electrode 12. Specifically, buffer layer 21 made of silicon carbide is formed on a surface of substrate 2 made of silicon carbide of n type conductivity. Buffer layer 21 has n type conductivity, and has a thickness of, for example, 0.5 μm. Further, an impurity with n type conductivity in the buffer layer has a concentration of, for example, $5 \times 10^{17}$ cm$^{-3}$. Formed on buffer layer 21 is breakdown voltage holding layer 22. Breakdown voltage holding layer 22 is made of silicon carbide of n type conductivity, and has a thickness of 10 μm, for example. Further, an impurity with n type conductivity in breakdown voltage holding layer 22 has a concentration of $5 \times 10^{15}$ cm$^{-3}$.

Breakdown voltage holding layer 22 has a surface in which p regions 23 of p type conductivity are formed with a space therebetween. In each of p regions 23, an n+ region 24 is formed at the surface layer of p region 23. At a location adjacent to n+ region 24, a p+ region 25 is formed. Gate insulating film 26 is formed to extend above p region 23 and n+ region 24 and make contacts with p+ region 25 and breakdown voltage holding layer 22. On gate insulating film 26, gate electrode 10 is formed. Further, source electrodes 11 are formed on n+ regions 24 and p+ regions 25. On source electrode 11, upper source electrode 27 is formed. Moreover, drain electrode 12 is formed on the backside surface of substrate 2 opposite to its surface on which buffer layer 21 is formed.

In an interface region between gate insulating film 26 and each of n+ region 24, p+ region 25, p region 23, and breakdown voltage holding layer 22 each serving as a semiconductor layer (for example, region within 10 nm from the interface), nitrogen atoms are introduced in a below-described nitrogen annealing step, and by a post-heat treatment step, the nitrogen atoms facilitates termination of dangling bonds and facilitates diffusion of carbon atoms out of the interface region. Accordingly, the interface state density is reduced sufficiently. In this way, as with silicon carbide semiconductor device 1 shown in FIG. 1, mobility can be improved particularly in the channel region below gate insulating film 26 (the portion of each p region 23 making contact with gate insulating film 26 and located between n+ region 24 and breakdown voltage holding layer 22).

The following describes a method for manufacturing the silicon carbide semiconductor device shown in FIG. 6.

First, a substrate preparing step (S10) is performed. Here, as with the method for manufacturing the silicon carbide semiconductor device in the first embodiment, substrate 2 having any plane orientation is prepared. Examples of substrate 2 prepared includes a substrate 2 (see FIG. 6) that has a main surface corresponding to a {03-38} plane and that is made of silicon carbide of n type. It should be noted that the main surface may correspond to a {0-11-2} plane, and the {0-11-2} plane may be constructed from a {0-33-8} plane and a {0-11-1} plane.

Next, an epitaxial layer forming step (S20) is performed. Specifically, buffer layer 21 (see FIG. 6) is formed on the surface of substrate 2. As the buffer layer, an epitaxial layer is formed which is made of silicon carbide of n type conductivity and has a thickness of 0.5 μm, for example. Buffer layer 21 has a conductive impurity at a concentration of, for example, $5 \times 10^{17}$ cm$^{-3}$. On buffer layer 21, breakdown voltage holding layer 22 (see FIG. 6) is formed. Breakdown voltage holding layer 22 is a layer made of silicon carbide having n type conductivity, for example. Breakdown voltage holding layer 22 has a thickness of, for example, 10 μm. Further, breakdown voltage holding layer 22 contains an impurity of n type conductivity at a concentration of, for example, $5 \times 10^{15}$ cm$^{-3}$.

Next, an implantation step (S25) is performed. Specifically, an impurity of p type conductivity is implanted into breakdown voltage holding layer 22 using, as a mask, an oxide film formed through photolithography and etching, thereby forming p regions 23 (see FIG. 6). Further, after removing the oxide film, an oxide film having a new pattern is formed through photolithography and etching. Using this oxide film as a mask, an impurity of n type conductivity is implanted into predetermined regions to form n+ regions 24 (see FIG. 6). In a similar way, an impurity of p type conductivity is implanted to form p+ regions 25 (see FIG. 6).

Next, activation annealing treatment is performed to activate the implanted impurities. In this activation annealing treatment, silicon carbide substrate 13 is heated at a heating temperature of 1700° C. for 30 minutes, for example.

Figure 7:
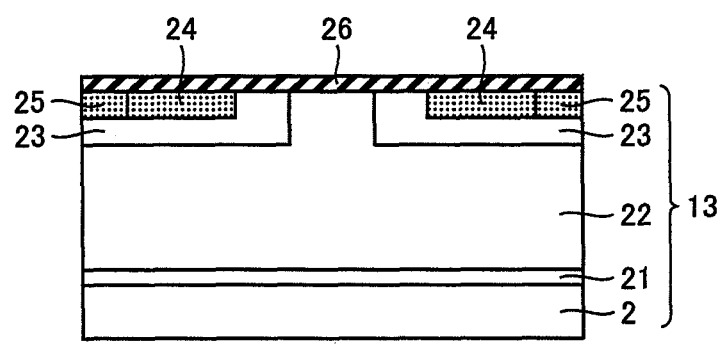
FIG. 7 is a schematic cross sectional view for schematically illustrating a first step of the method for manufacturing the silicon carbide semiconductor device in the second embodiment of the present invention.

Next, as shown in FIG. 2, a gate insulating film forming step (S30) is performed. Specifically, referring to FIG. 7, by heating silicon carbide substrate 13 in an atmosphere containing oxygen, gate insulating film 8 is formed on and in contact with silicon carbide substrate 13 (first heating step). Gate insulating film 8 has a thickness of, for example, 50 nm. Gate insulating film 8 is formed by means of, for example, thermal oxidation. The thermal oxidization treatment is performed, for example, at an oxidizing temperature of not less than 1100° C. and not more than 1400° C. in an oxygen-containing atmosphere or a diluted oxygen atmosphere. The thermal oxidization treatment is performed for a period of time appropriately determined depending on the film thickness of gate insulating film 8 to be formed. It should be noted that the upper surfaces of p type layer 4 and n+ regions 5, 6 may be cleaned before the oxidization in gate insulating film forming step (S30). As a cleaning method, any conventionally known cleaning method can be used.

Next, a nitrogen annealing step (S40) is performed as shown in FIG. 2. Specifically, silicon carbide substrate 13 having gate insulating film 8 is heated at 1250° C. or more in an atmosphere containing nitrogen and nitrogen monoxide (second heating step). A value obtained by dividing partial pressure of the nitrogen monoxide by a total of partial pressure of the nitrogen and the partial pressure of the nitrogen monoxide in the second heating step is more than 3% and less than 10%. The heating time is, for example, approximately 1 hour. As a result, nitrogen atoms can be introduced into the interface region between gate insulating film 8 and p type layer 4 as well as the interface region between gate insulating film 8 and each of n+ regions 5, 6.

In the second heating step, the NO partial pressure is preferably not less than 4% and not more than 9%, more preferably, not less than 5% and not more than 9%. Further, the heating temperature in the second heating step is preferably not less than 1250° C. and not more than 1350° C., more preferably, not less than 1250° C. and not more than 1330° C., further preferably, not less than 1250° C. and not more than 1300° C.

Next, as shown in FIG. 2, a post-heat treatment step (S50) is performed. Specifically, after nitrogen annealing step (S40), silicon carbide substrate 13 having gate insulating film 8 is heated in an inert gas atmosphere (third heating step). Examples of the inert gas include argon gas, nitrogen gas, and the like.

It should be noted that the first heating step, the second heating step, and the third heating step are preferably performed under the conditions illustrated in FIG. 3 of the first embodiment.

Next, an electrode forming step (S60) is performed. Specifically, gate electrode 10 is formed on gate insulating film 26. Further, after removing a portion of the oxide film above n+ region 24 and p+ region 25 by means of etching, a metal film such as nickel is formed in contact with n+ region 24 and p+ region 25. It should be noted that on this occasion, heat treatment for alloying is performed. As a result, as shown in FIG. 6, source electrodes 11 and drain electrode 12 are formed. Thereafter, on source electrodes 11, upper source electrodes 27 (see FIG. 6) are formed. In this way, silicon carbide semiconductor device 1 shown in FIG. 6 is obtained.

It should be noted that a MOSFET may be employed in which n type conductivity and p type conductivity in each of the above-described embodiments are replaced with each other. Further, in the description above, as one example of silicon carbide semiconductor device 1 of the present invention, a planer type MOSFET has been illustrated but the present invention is not limited to this. For example, silicon carbide semiconductor device 1 may be, for example, a trench type MOSFET, IGBT (Insulated Gate Bipolar Transistor), or the like.

EXAMPLE

In the present example, an experiment was conducted to examine NO partial pressure and annealing temperature so as to attain high mobility. First, a MOSFET serving as silicon carbide semiconductor device 1 described in the second embodiment was manufactured. This MOSFET was manufactured under the conditions illustrated in the second embodiment except the following conditions. The oxidizing temperature in the first heating step (gate insulating film forming step) was set at 1300° C. The NO treatment temperature in the second heating step (nitriding annealing step) was set at 1270° C. The Ar annealing temperature in the third heating step (post-heat treatment) was set at 1300° C. The impurity in p region 24 was aluminum and was at a concentration of $1\times10^{17}$ cm$^{-3}$. The activation annealing was performed at 1700° C. for 30 minutes.

Figure 8:
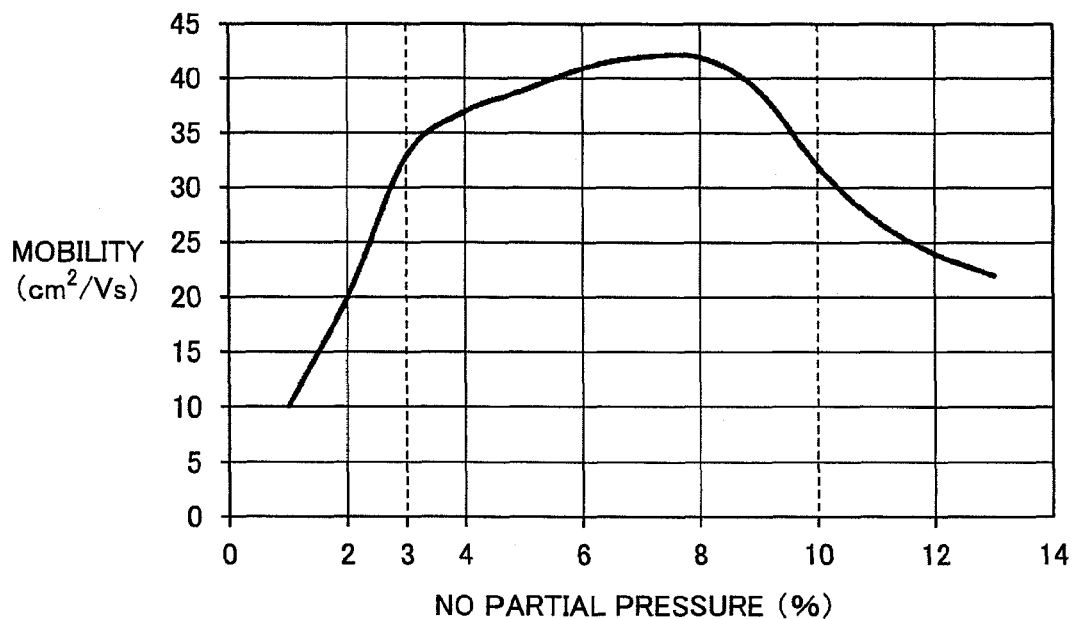
FIG. 8 shows a relation between mobility and nitrogen monoxide partial pressure.

The MOSFET was fabricated while changing the NO partial pressure in the second heating step (value obtained by dividing the partial pressure of the nitrogen monoxide by the total of the pressures of the nitrogen monoxide and the nitrogen) from 1% to 13%. Then, the mobility of the MOSFET was measured. FIG. 8 shows a relation between the mobility and the NO partial pressure. As shown in FIG. 8, it was confirmed that when the NO partial pressure fell in the range of more than 3% and less than 10%, the mobility was of high value such as approximately 32 cm$^2$/V$_s$ or more. Further, it was confirmed that when the NO partial pressure fell in the range of not less than 5% and not more than 9%, the mobility was of higher value such as approximately 38 cm$^2$/V$_s$ or more.

Figure 9:
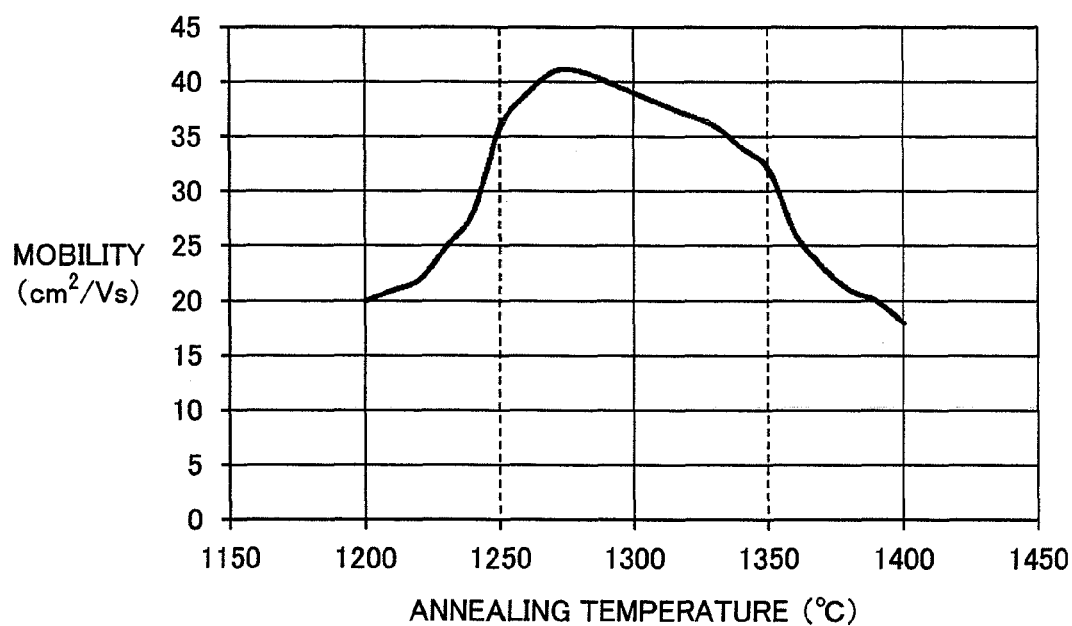
FIG. 9 shows a relation between the mobility and annealing temperature in the nitrogen annealing step.

Next, a MOSFET was fabricated with the annealing temperature being changed from 1200° C. to 1400° C. in the second heating step. The mobility of the MOSFET was measured. It should be noted that the NO partial pressure in the second heating step was set at 8%. FIG. 9 shows a relation between the mobility and the annealing temperature. As shown in FIG. 9, it was confirmed that when the annealing temperature fell in the range of not less than 1250° C. and not more than 1350° C., the mobility was of high value such as approximately 32 cm$^2$/V$_s$ or more. Further, it was confirmed that when the annealing temperature fell in the range of no less than 1200° C. and not more than 1300° C., the mobility was of higher value such as approximately 35 cm$^2$/V$_s$ or more.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device comprising:
    a first heating step of heating a silicon carbide substrate in an atmosphere containing oxygen, so as to form a gate insulating film on and in contact with said silicon carbide substrate; and
    a second heating step of heating said silicon carbide substrate having said gate insulating film, at 1250° C. or more in an atmosphere containing nitrogen and nitrogen monoxide,
    a value obtained by dividing partial pressure of said nitrogen monoxide by a total of partial pressure of said nitrogen and the partial pressure of said nitrogen monoxide in said second heating step being not less than 5% and not more than 9%.

2. The method for manufacturing the silicon carbide semiconductor device according to claim 1, wherein in said second heating step, said silicon carbide substrate having said gate insulating film is heated at 1350° C. or less.

3. The method for manufacturing the silicon carbide semiconductor device according to claim 1, further comprising a third heating step of heating said silicon carbide substrate having said gate insulating film in an inert gas atmosphere after said second heating step, wherein
    in said third heating step, said silicon carbide substrate has a temperature higher than that of said silicon carbide substrate in said first heating step.

4. The method for manufacturing the silicon carbide semiconductor device according to claim 1, further comprising a step of substituting oxygen in said atmosphere with nitrogen between said first heating step and said second heating step.

5. The method for manufacturing the silicon carbide semiconductor device according to claim 4, wherein after the step of substituting said oxygen with the nitrogen, the temperature of said silicon carbide substrate is changed to the temperature in said second heating step.

* * * * *